(12) United States Patent
Chen et al.

(10) Patent No.: US 10,943,823 B2
(45) Date of Patent: Mar. 9, 2021

(54) CONDUCTIVE FEATURE FORMATION AND STRUCTURE USING BOTTOM-UP FILLING DEPOSITION

(71) Applicant: Taiwan Semiconductor Manufacturing Company, Ltd., Hsinchu (TW)

(72) Inventors: Pin-Wen Chen, Keelung (TW); Chia-Han Lai, Zhubei (TW); Chih-Wei Chang, Hsinchu (TW); Mei-Hui Fu, Hsinchu (TW); Ming-Hsing Tsai, Chu-Pei (TW); Wei-Jung Lin, Hsinchu (TW); Yu Shih Shih Wang, Tainan (TW); Ya-Yi Cheng, Taichung (TW); I-Li Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/654,845

(22) Filed: Oct. 16, 2019

(65) Prior Publication Data
US 2020/0051858 A1 Feb. 13, 2020

Related U.S. Application Data

(62) Division of application No. 15/920,727, filed on Mar. 14, 2018, now Pat. No. 10,475,702.

(51) Int. Cl.
*H01L 21/768* (2006.01)
*H01L 23/535* (2006.01)
(Continued)

(52) U.S. Cl.
CPC .. *H01L 21/76895* (2013.01); *H01L 21/28556* (2013.01); *H01L 21/32134* (2013.01); *H01L 21/76883* (2013.01); *H01L 23/535* (2013.01)

(58) Field of Classification Search
CPC ......... H01L 23/53266; H01L 21/28518; H01L 21/76802; H01L 21/76843; H01L 21/76846; H01L 21/76855
See application file for complete search history.

(56) References Cited

U.S. PATENT DOCUMENTS

| 5,470,790 A | 11/1995 | Myers et al. |
| 6,222,272 B1 | 4/2001 | Takayama et al. |

(Continued)

FOREIGN PATENT DOCUMENTS

TW I559447 B 11/2016

*Primary Examiner* — Dung A. Le
(74) *Attorney, Agent, or Firm* — Slater Matsil, LLP

(57) ABSTRACT

The present disclosure provides example embodiments relating to conductive features, such as metal contacts, vias, lines, etc., and methods for forming those conductive features. In some embodiments, a structure includes a first dielectric layer over a substrate, a first conductive feature through the first dielectric layer, the first conductive feature comprising a first metal, a second dielectric layer over the first dielectric layer, and a second conductive feature through the second dielectric layer having a lower convex surface extending into the first conductive feature, wherein the lower convex surface of the second conductive feature has a tip end extending laterally under a bottom boundary of the second dielectric layer.

20 Claims, 13 Drawing Sheets

(51) Int. Cl.
    *H01L 21/3213*     (2006.01)
    *H01L 21/285*     (2006.01)

(56) References Cited

U.S. PATENT DOCUMENTS

| | | |
|---|---|---|
| 6,224,737 B1 | 5/2001 | Tsai et al. |
| 6,548,905 B2 | 4/2003 | Park et al. |
| 7,423,347 B2 | 9/2008 | Chen et al. |
| 7,517,736 B2 | 4/2009 | Mehta et al. |
| 8,277,619 B2 | 10/2012 | Chang et al. |
| 9,105,490 B2 | 8/2015 | Wang et al. |
| 9,236,267 B2 | 1/2016 | De et al. |
| 9,236,300 B2 | 1/2016 | Liaw |
| 9,397,045 B2 * | 7/2016 | Peng ................. H01L 21/76814 |
| 9,406,804 B2 | 8/2016 | Huang |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,640,509 B1 * | 5/2017 | Yang ....................... H01L 24/03 |
| 9,831,183 B2 | 11/2017 | Lin et al. |
| 9,859,386 B2 | 1/2018 | Ho et al. |
| 9,935,051 B2 * | 4/2018 | Adusumilli ....... H01L 21/76843 |
| 10,163,786 B2 | 12/2018 | Yang |
| 10,396,013 B2 * | 8/2019 | Edelstein ................ H01L 24/73 |
| 2002/0090796 A1 | 7/2002 | Desai et al. |
| 2012/0074571 A1 * | 3/2012 | Lavoie ............. H01L 21/76874 |
| | | 257/751 |
| 2016/0030766 A1 | 2/2016 | Scritchfield et al. |
| 2016/0111371 A1 | 4/2016 | Peng et al. |
| 2017/0092590 A1 | 3/2017 | Spooner et al. |
| 2020/0127049 A1 * | 4/2020 | Kalnitsky ............. H01L 27/228 |

* cited by examiner

CONDUCTIVE FEATURE FORMATION AND STRUCTURE USING BOTTOM-UP FILLING DEPOSITION

PRIORITY CLAIM AND CROSS-REFERENCE

This application is a divisional of U.S. application Ser. No. 15/920,727 filed on Mar. 14, 2018, which application is incorporated herein by reference.

BACKGROUND

The semiconductor integrated circuit (IC) industry has experienced exponential growth. Technological advances in IC materials and design have produced generation of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
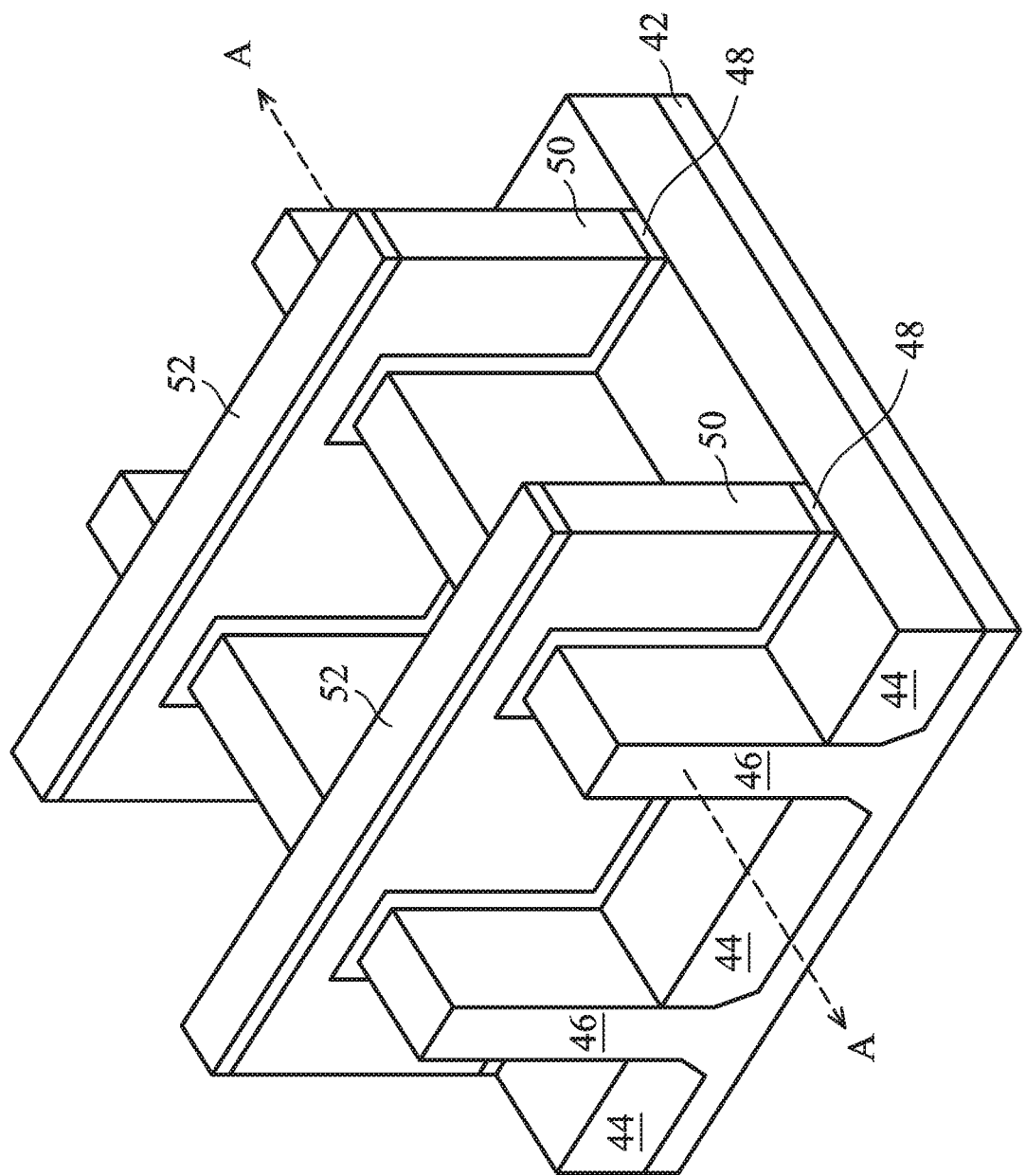
FIGS. 1 through 12 are views of respective intermediate structures at respective stages during an example method for forming conductive features in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, vias, lines, etc., and methods for forming those conductive features. An overlying conductive feature, formed in an overlying dielectric layer, is formed to have a convex structure to mate with a concave surface from an underlying conductive feature. The convex structure from the overlying conductive feature can, among other benefits, further have tip ends that assist adhering on the underlying conductive features formed in the underlying dielectric structure where the underling conductive feature is formed in. Thus, adhesion and interface management may be better controlled. The overall contact surface area of the second conductive feature is also increased, thus efficiently increasing electrical performance and reduce contact resistance.

Example embodiments described herein are described in the context of forming conductive features in Back End Of the Line (BEOL) and/or Middle End Of the Line (MEOL) processing for a Fin Field Effect Transistor (FinFET). Other embodiments may be implemented in other contexts, such as with different devices, such as planar Field Effect Transistors (FETs), Vertical Gate All Around (VGAA) FETs, Horizontal Gate All Around (HGAA) FETs, bipolar junction transistors (BJTs), diodes, capacitors, inductors, resistors, etc. In some instances, the conductive feature may be part of the device, such as a plate of a capacitor or a line of an inductor. Further, some embodiments may be implemented in Front End Of the Line (FEOL) processing and/or for forming any conductive feature. Implementations of some aspects of the present disclosure may be used in other processes and/or in other devices.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIGS. 1 through 12 illustrate views of respective intermediate structures at respective stages during an example method for forming conductive features in accordance with some embodiments. FIG. 1 illustrates a perspective view of an intermediate structure at a stage of the example method. The intermediate structure, as described in the following, is used in the implementation of FinFETs. Other structures may be implemented in other example embodiments.

The intermediate structure includes first and second fins 46 formed on a semiconductor substrate 42, with respective isolation regions 44 on the semiconductor substrate 42 between neighboring fins 46. First and second dummy gate stacks are along respective sidewalls of and over the fins 46.

The first and second dummy gate stacks each include an interfacial dielectric 48, a dummy gate 50, and a mask 52.

The semiconductor substrate 42 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 42 may include an elemental semiconductor such as silicon (Si) or germanium (Ge); a compound semiconductor; an alloy semiconductor; or a combination thereof.

The fins 46 are formed in the semiconductor substrate 42. For example, the semiconductor substrate 42 may be etched, such as by appropriate photolithography and etch process, such that trenches are formed between neighboring pairs of fins 46 and such that the fins 46 protrude from the semiconductor substrate 42. Isolation regions 44 are formed with each being in a corresponding trench. The isolation regions 44 may include or be an insulating material such as an oxide (such as silicon oxide), a nitride, the like, or a combination thereof. The insulating material may then be recessed after being deposited to form the isolation regions 44. The insulating material is recessed using an acceptable etch process such that the fins 46 protrude from between neighboring isolation regions 44, which may, at least in part, thereby delineate the fins 46 as active areas on the semiconductor substrate 42. The fins 46 may be formed by other processes, and may include homoepitaxial and/or heteroepitaxial structures, for example.

The dummy gate stacks are formed on the fins 46. In a replacement gate process as described herein, the interfacial dielectrics 48, dummy gates 50, and masks 52 for the dummy gate stacks may be formed by sequentially forming respective layers by appropriate deposition processes, for example, and then patterning those layers into the dummy gate stacks by appropriate photolithography and etch processes. For example, the interfacial dielectrics 48 may include or be silicon oxide, silicon nitride, the like, or multilayers thereof. The dummy gates 50 may include or be silicon (e.g., polysilicon) or another material. The masks 52 may include or be silicon nitride, silicon oxynitride, silicon carbon nitride, the like, or a combination thereof.

In other examples, instead of and/or in addition to the dummy gate stacks, the gate stacks can be operational gate stacks (or more generally, gate structures) in a gate-first process. In a gate-first process, the interfacial dielectric 48 may be a gate dielectric layer, and the dummy gate 50 may be a gate electrode. The gate dielectric layers, gate electrodes, and masks 52 for the operational gate stacks may be formed by sequentially forming respective layers by appropriate deposition processes, and then patterning those layers into the gate stacks by appropriate photolithography and etch processes. For example, the gate dielectric layers may include or be silicon oxide, silicon nitride, a high-k dielectric material, the like, or multilayers thereof. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate electrodes may include or be silicon (e.g., polysilicon, which may be doped or undoped), a metal-containing material (such as titanium, tungsten, aluminum, ruthenium, or the like), a combination thereof (such as a silicide (which may be subsequently formed), or multiple layers thereof. The masks 52 may include or be silicon nitride, silicon oxynitride, silicon carbon nitride, the like, or a combination thereof.

Figure 2:
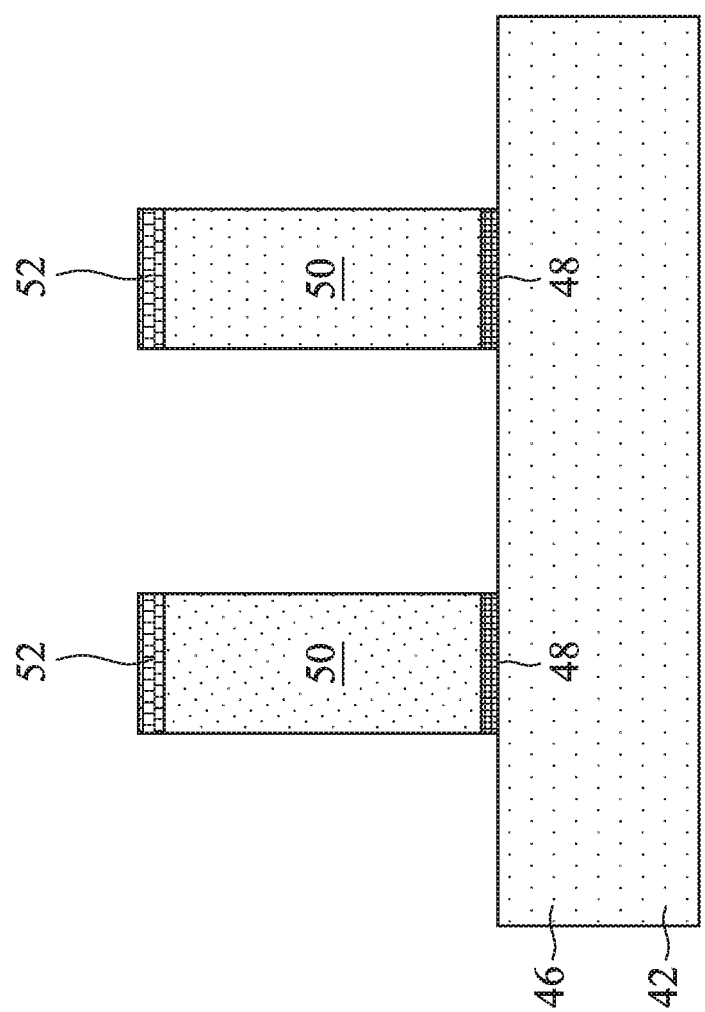

FIG. 1 further illustrates a reference cross-section that is used in later figures. Cross-section A-A is in a plane along, e.g., channels in the fin 46 between opposing source/drain regions. The FIGS. 2 through 12 illustrate cross-sectional views at various stages of processing in various example methods corresponding to cross-section A-A. FIG. 2 illustrates a cross-sectional view of the intermediate structure of FIG. 1 at the cross-section A-A.

Figure 3:
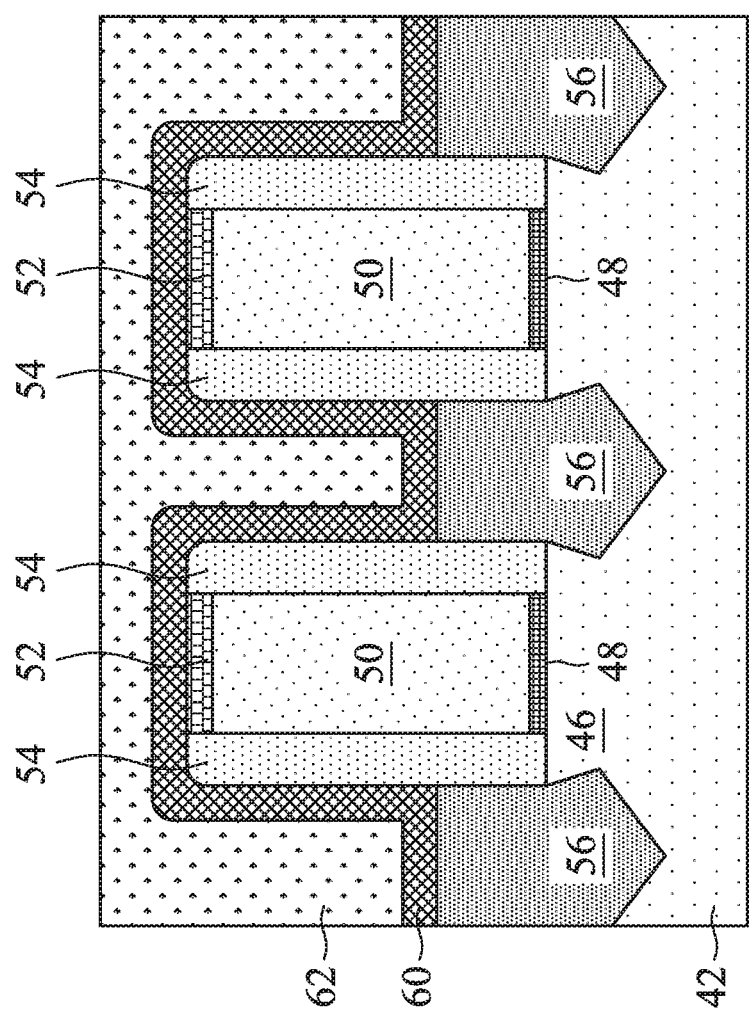

FIG. 3 illustrates the formation of gate spacers 54, epitaxy source/drain regions 56, a contact etch stop layer (CESL) 60, and a first interlayer dielectric (ILD) 62. Gate spacers 54 are formed along sidewalls of the dummy gate stacks (e.g., sidewalls of the interfacial dielectrics 48, dummy gates 50, and masks 52) and over the fins 46. The gate spacers 54 may be formed by conformally depositing, by an appropriate deposition process, one or more layers for the gate spacers 54 and anisotropically etching the one or more layers, for example. The one or more layers for the gate spacers 54 may include or be silicon oxygen carbide, silicon nitride, silicon oxynitride, silicon carbon nitride, the like, multi-layers thereof, or a combination thereof.

Recesses are then formed in the fins 46 on opposing sides of the dummy gate stacks (e.g., using the dummy gate stacks and gate spacers 54 as a mask) by an etch process. The etch process can be isotropic or anisotropic, or further, may be selective with respect to one or more crystalline planes of the semiconductor substrate 42. Hence, the recesses can have various cross-sectional profiles based on the etch process implemented. The epitaxy source/drain regions 56 are formed in the recesses. The epitaxy source/drain regions 56 may include or be silicon germanium, silicon carbide, silicon phosphorus, silicon carbon phosphorus, pure or substantially pure germanium, a III-V compound semiconductor, a II-VI compound semiconductor, or the like. The epitaxy source/drain regions 56 may be formed in the recesses by an appropriate epitaxial growth or deposition process. In some examples, epitaxy source/drain regions 56 can be raised with respect to the fin 46, and can have facets, which may correspond to crystalline planes of the semiconductor substrate 42.

A person having ordinary skill in the art will also readily understand that the recessing and epitaxial growth may be omitted, and that source/drain regions may be formed by implanting dopants into the fins 46 using the dummy gate stacks and gate spacers 54 as masks. In some examples where epitaxy source/drain regions 56 are implemented, the epitaxy source/drain regions 56 may also be doped, such as by in situ doping during epitaxial growth and/or by implanting dopants into the epitaxy source/drain regions 56 after epitaxial growth. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

The CESL 60 is conformally deposited, by an appropriate deposition process, on surfaces of the epitaxy source/drain regions 56, sidewalls and top surfaces of the gate spacers 54, top surfaces of the masks 52, and top surfaces of the isolation regions 44. Generally, an etch stop layer (ESL) can provide a mechanism to stop an etch process when forming, e.g., contacts or vias. An ESL may be formed of a dielectric material having a different etch selectively from adjacent layers or components. The CESL 60 may comprise or be silicon nitride, silicon carbon nitride, silicon carbon oxide, carbon nitride, the like, or a combination thereof.

The first ILD 62 is deposited, by an appropriate deposition process, on the CESL 60. The first ILD 62 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof.

The first ILD 62 may be planarized after being deposited, such as by a chemical mechanical planarization (CMP). In a gate-first process, a top surface of the first ILD 62 may be above the upper portions of the CESL 60 and the gate stacks, and processing described below with respect to FIGS. 4 and 5 may be omitted. Hence, the upper portions of the CESL 60 and first ILD 62 may remain over the gate stacks.

Figure 4:
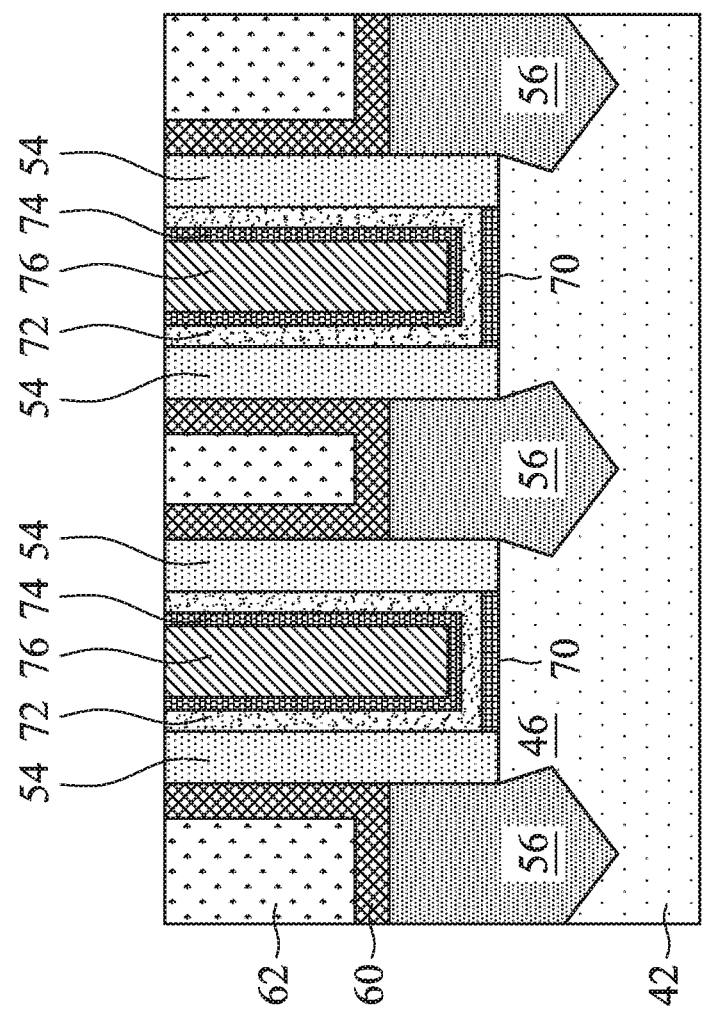

FIG. 4 illustrates the replacement of the dummy gate stacks with replacement gate structures. The first ILD 62 and CESL 60 are formed with top surfaces coplanar with top surfaces of the dummy gates 50. A planarization process, such as a CMP, may be performed to level the top surfaces of the first ILD 62 and CESL 60 with the top surfaces of the dummy gates 50. The CMP may also remove the masks 52 (and, in some instances, upper portions of the gate spacers 54) on the dummy gates 50. Accordingly, top surfaces of the dummy gates 50 are exposed through the first ILD 62 and the CESL 60.

With the dummy gates 50 exposed through the first ILD 62 and the CESL 60, the dummy gates 50 are removed, such as by one or more etch processes. The dummy gates 50 may be removed by an etch process selective to the dummy gates 50, wherein the interfacial dielectrics 48 act as ESLs, and subsequently, the interfacial dielectrics 48 can optionally be removed by a different etch process selective to the interfacial dielectrics 48. Recesses are formed between gate spacers 54 where the dummy gate stacks are removed, and channel regions of the fins 46 are exposed through the recesses.

The replacement gate structures are formed in the recesses where the dummy gate stacks were removed. The replacement gate structures each include, as illustrated, an interfacial dielectric 70, a gate dielectric layer 72, one or more optional conformal layers 74, and a gate conductive fill material 76. The interfacial dielectric 70 is formed on sidewalls and top surfaces of the fins 46 along the channel regions. The interfacial dielectric 70 is formed on sidewalls and top surfaces of the fins 46 along the channel regions. The interfacial dielectric 70 can be, for example, the interfacial dielectric 48 if not removed, an oxide (e.g., silicon oxide) formed by thermal or chemical oxidation of the fin 46, and/or an oxide (e.g., silicon oxide), nitride (e.g., silicon nitride), and/or another dielectric layer.

The gate dielectric layer 72 can be conformally deposited in the recesses where dummy gate stacks were removed (e.g., on top surfaces of the isolation regions 44, on the interfacial dielectric 70, and sidewalls of the gate spacers 54) and on the top surfaces of the first ILD 62, the CESL 60, and gate spacers 54. The gate dielectric layer 72 can be or include silicon oxide, silicon nitride, a high-k dielectric material (examples of which are provided above), multilayers thereof, or other dielectric material.

Then, the one or more optional conformal layers 74 can be conformally (and sequentially, if more than one) deposited on the gate dielectric layer 72. The one or more optional conformal layers 74 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

A layer for the gate conductive fill material 76 is formed over the one or more optional conformal layers 74 (e.g., over the one or more work-function tuning layers), if implemented, and/or the gate dielectric layer 72. The layer for the gate conductive fill material 76 can fill remaining recesses where the dummy gate stacks were removed. The layer for the gate conductive fill material 76 may be or comprise a metal-containing material such as tungsten, cobalt, aluminum, ruthenium, copper, multi-layers thereof, a combination thereof, or the like. Portions of the layer for the gate conductive fill material 76, one or more optional conformal layers 74, and gate dielectric layer 72 above the top surfaces of the first ILD 62, the CESL 60, and gate spacers 54 are removed, such as by a CMP. The replacement gate structures comprising the gate conductive fill material 76, one or more optional conformal layers 74, gate dielectric layer 72, and interfacial dielectric 70 may therefore be formed as illustrated in FIG. 4.

Figure 5:
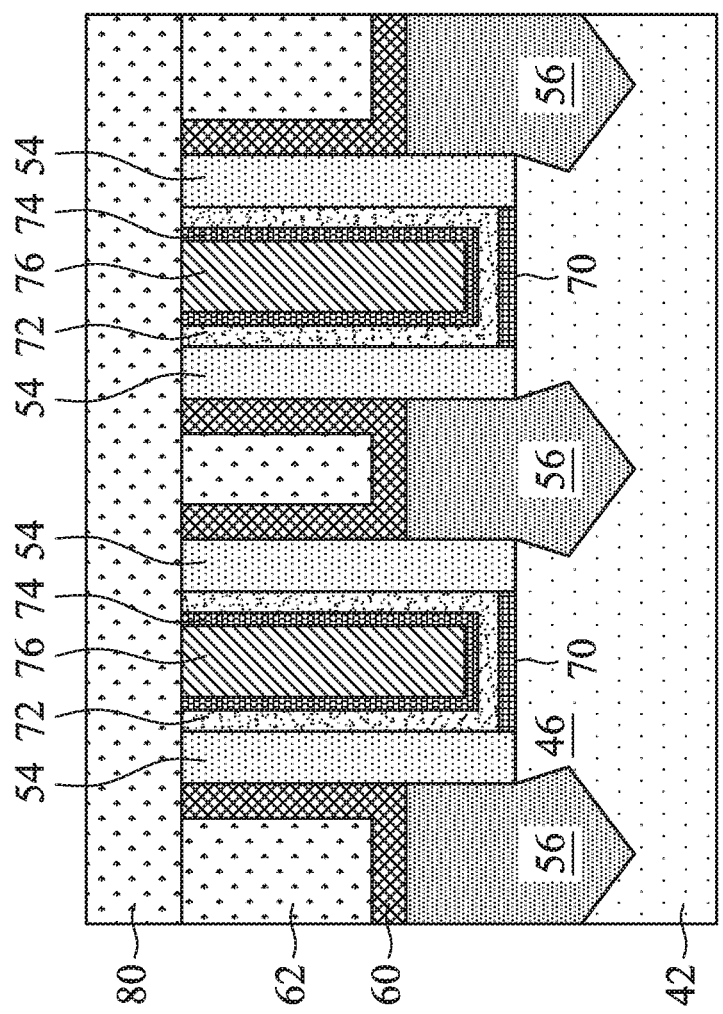

FIG. 5 illustrates the formation of a second ILD 80 over the first ILD 62, CESL 60, gate spacers 54, and replacement gate structures. Although not illustrated, inn some examples, and ESL may be deposited over the first ILD 62, etc., and the second ILD 80 may be deposited over the ESL. If implemented, the ESL may comprise or be silicon nitride, silicon carbon nitride, silicon carbon oxide, carbon nitride, the like, or a combination thereof. The second ILD 80 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

Figure 6:
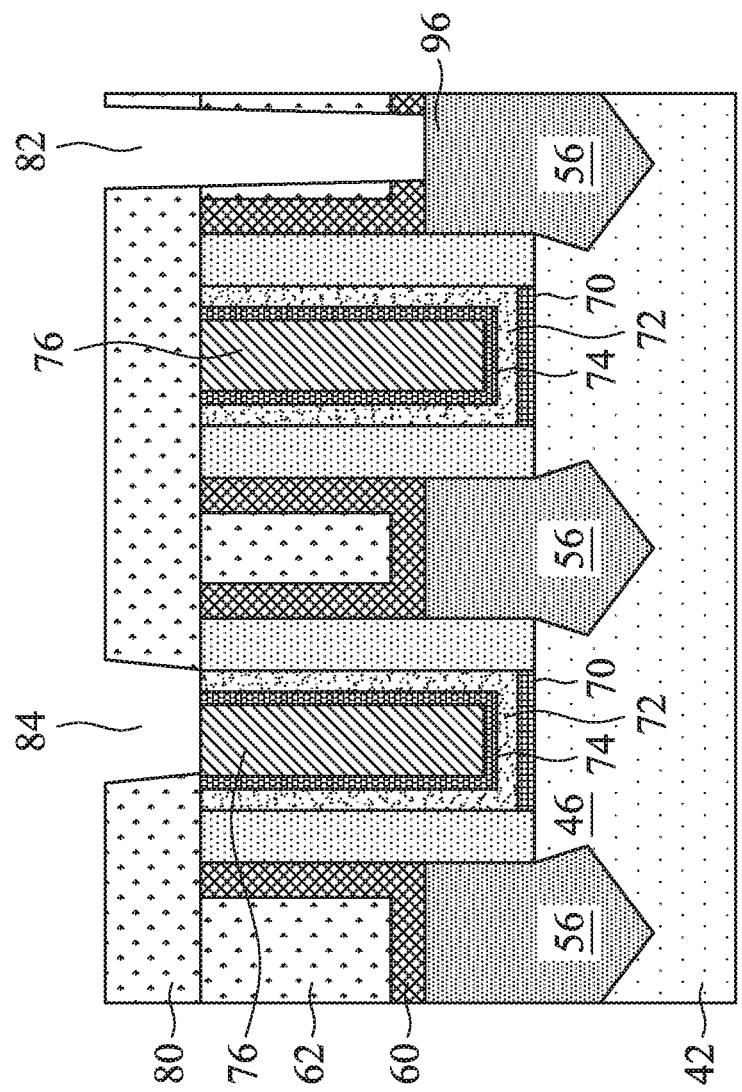

FIG. 6 illustrates the formation of respective openings 82 and 84 through the second ILD 80, the first ILD 62, and the CESL 60 to expose at least a portion of an epitaxy source/drain region 56, and through the second ILD 80 to expose at least a portion of a replacement gate structure. The second ILD 80, the first ILD 62, and the CESL 60 may be patterned with the openings 82 and 84, for example, using photolithography and one or more etch processes.

Figure 7:
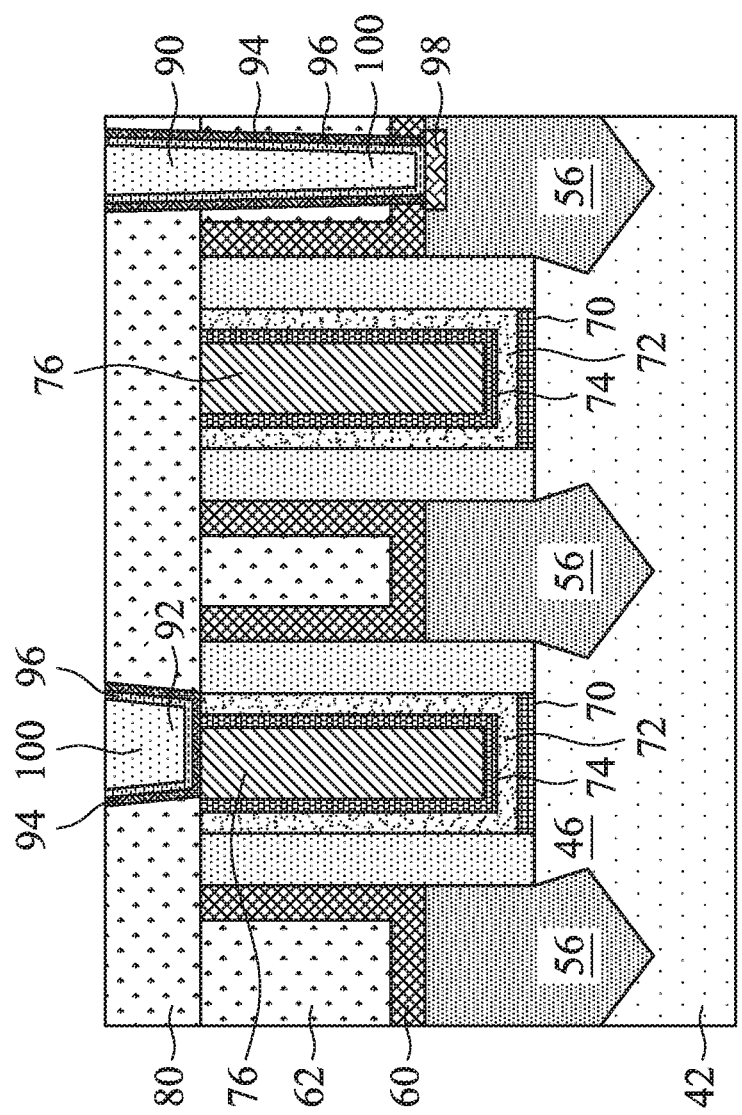

FIG. 7 illustrates the formation of conductive features 90 and 92 in the openings 82 and 84 to the epitaxy source/drain region 56 and to the replacement gate structure, respectively. The conductive feature 90 includes, in the illustrated example, an adhesion layer 94, a barrier layer 96 on the adhesion layer 94, a silicide region 98 on the epitaxy source/drain region 56, and a conductive fill material 100 on the barrier layer 96, for example. The conductive feature 92 includes, in the illustrated example, an adhesion layer 94, a barrier layer 96 on the adhesion layer 94, and conductive fill material 100 on the barrier layer 96, for example.

The adhesion layer 94 can be conformally deposited in the openings 82 and 84 (e.g., on sidewalls of the openings 82 and 84, exposed surface of the epitaxy source/drain region 56, and exposed surface of the replacement gate structure) and over the second ILD 80. The adhesion layer 94 may be or comprise titanium, tantalum, the like, or a combination thereof, and may be deposited by atomic layer deposition (ALD), chemical vapor deposition (CVD), physical vapor deposition (PVD), or another deposition technique. The barrier layer 96 can be conformally deposited on the adhesion layer 94, such as in the openings 82 and 84 and over the second ILD 80. The barrier layer 96 may be or comprise titanium nitride, titanium oxide, tantalum nitride, tantalum oxide, the like, or a combination thereof, and may be deposited by ALD, CVD, or another deposition technique. In some examples, at least a portion of the adhesion layer 94 can be treated to form the barrier layer 96. For example, a nitridation process, such as including a nitrogen plasma process, can be performed on the adhesion layer 94 to convert at least the portion of the adhesion layer 94 into the barrier layer 96. In some examples, the adhesion layer 94 can be completely converted such that no adhesion layer 94 remains and the barrier layer 96 is an adhesion/barrier layer, while in other examples, a portion of the adhesion layer 94 remains unconverted such that the portion of the adhesion layer 94 remains with the barrier layer 96 on the adhesion layer 94.

Silicide region 98 may be formed on the epitaxy source/drain region 56 by reacting an upper portion of the epitaxy source/drain region 56 with the adhesion layer 94, and possibly, the barrier layer 96. An anneal can be performed to facilitate the reaction of the epitaxy source/drain region 56 with the adhesion layer 94 and/or barrier layer 96.

The conductive fill material 100 can be deposited on the barrier layer 96 and fill the openings 82 and 84. The conductive fill material 100 may be or comprise cobalt, tungsten, copper, ruthenium, aluminum, gold, silver, alloys thereof, the like, or a combination thereof, and may be deposited by CVD, ALD, PVD, or another deposition technique. After the conductive fill material 100 is deposited, excess conductive fill material 100, barrier layer 96, and adhesion layer 94 may be removed by using a planarization process, such as a CMP, for example. The planarization process may remove excess conductive fill material 100, barrier layer 96, and adhesion layer 94 from above a top surface of the second ILD 80. Hence, top surfaces of the conductive features 90 and 92 and the second ILD 80 may be coplanar. The conductive features 90 and 92 may be or may be referred to as contacts, plugs, etc.

Although FIGS. 6 and 7 illustrate the conductive feature 90 to the epitaxy source/drain region 56 and the conductive feature 92 to the replacement gate structure being formed simultaneously, the respective conductive features 90 and 92 may be formed separately and sequentially. For example, the opening 82 to the epitaxy source/drain region 56 may be first formed, as in FIG. 6 and filled to form the conductive feature 90 to the epitaxy source/drain region 56, as in FIG. 7. Then, the opening 84 to the replacement gate structure may be formed, as in FIG. 6, and filled to form the conductive feature 92 to the replacement gate structure, as in FIG. 7. Another order of processing may be implemented.

Figure 8:
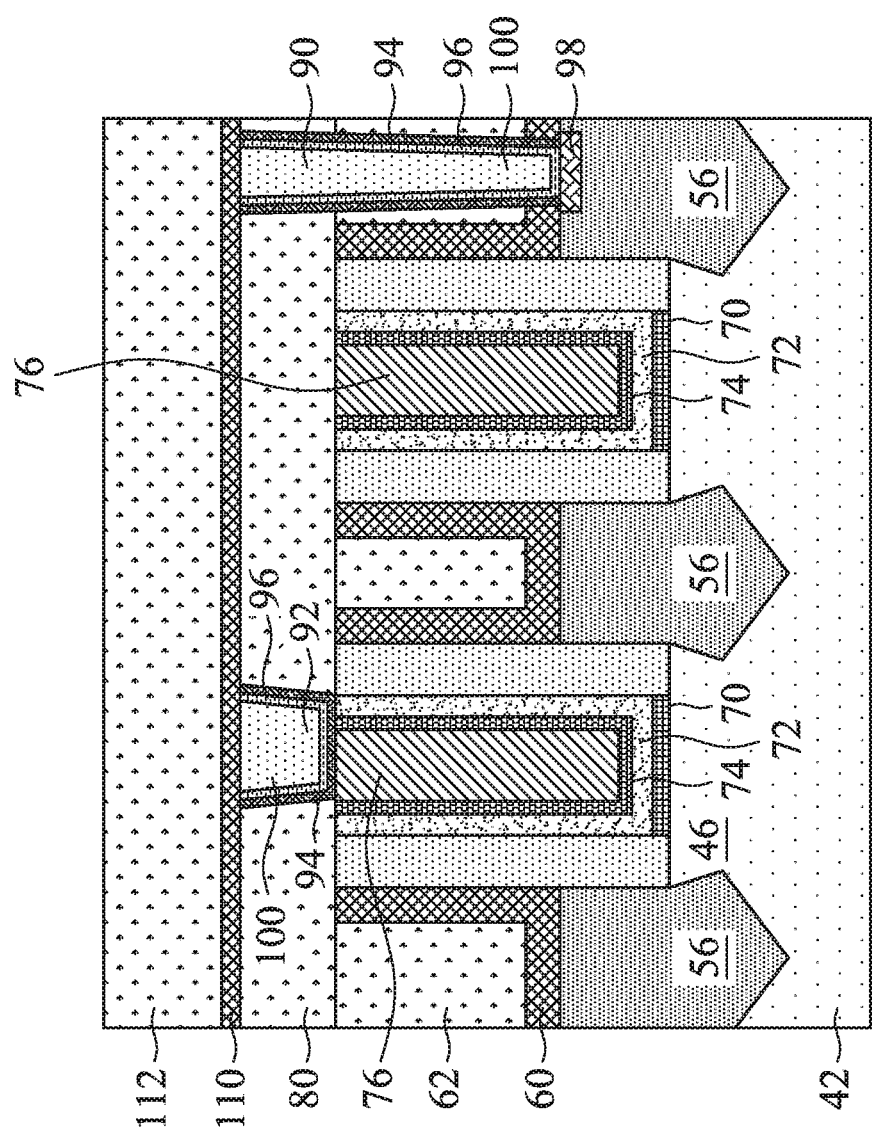

FIG. 8 illustrates the formation of an ESL 110 and an intermetallization dielectric (IMD) 112 over the ESL 110. The ESL 110 is deposited on top surfaces of the second ILD 80 and conductive features 90 and 92. The ESL 110 may comprise or be silicon nitride, silicon carbon nitride, silicon carbon oxide, carbon nitride, the like, or a combination thereof, and may be deposited by CVD, plasma enhanced CVD (PECVD), ALD, or another deposition technique. The IMD 112 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The IMD 112 may be deposited by spin-on, CVD, flowable CVD (FCVD), PECVD, PVD, or another deposition technique. A thickness of the ESL 110 can be in a range from about 10 nm to about 500 nm, and a thickness of the IMD 112 can be in a range from about 50 nm to about 800 nm. A combined thickness of the IMD 112 and ESL 110 can be in a range from about 100 nm to about 1000 nm.

Figure 9:
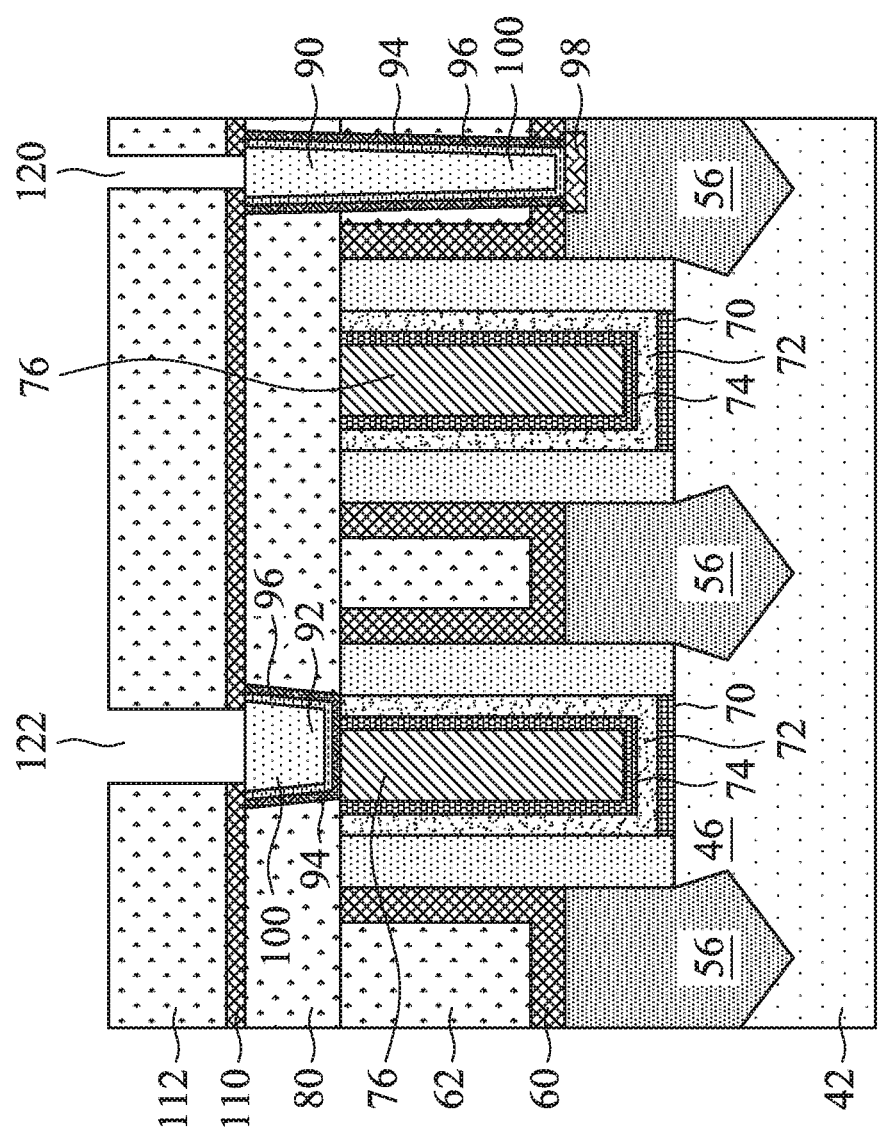

FIG. 9 illustrates the formation of openings 120 and 122 to the conductive features 90 and 92, respectively, through the IMD 112 and ESL 110. The IMD 112 and ESL 110 may be patterned with the openings 120 and 122, for example, using photolithography and one or more etch processes. The etch process may include a reactive ion etch (RIE), neutral beam etch (NBE), inductively coupled plasma (ICP) etch, capacitively coupled plasma (CCP) etch, ion beam etch (IBE), the like, or a combination thereof. The etch process may be anisotropic. In some examples, the etching process can include a plasma using a first gas comprising carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), a carbon fluoride (e.g., $C_xF_y$, where x can be in a range from 1 to 5 and y can be in a range from 4 to 8), the like, or a combination thereof. The plasma can further use a second gas comprising nitrogen ($N_2$), hydrogen ($H_2$), oxygen ($O_2$), argon (Ar), xenon (Xe), helium (He), carbon monoxide (CO), carbon dioxide ($CO_2$), carbonyl sulfide (COS), the like, or a combination thereof. An inert gas may be optionally supplied during the etching process. In some examples, a ratio of the flow rate of the first gas to the flow rate of the second gas can be in a range from about 1:1000 to about 1000:1, such as from about 1:10 to about 10:1. A pressure of the plasma etch can be in a range from about 0.1 mTorr to about 100 mTorr. A power of the plasma generator for the plasma etch can be in a range from about 30 W to about 5000 W. A frequency of the plasma generator for the plasma etch can be about 40 KHz, about 2 MHz, or from about 12 MHz to about 100 MHz, such as about 13.56 MHz. A substrate bias voltage of the plasma etch can be in a range from about 10 kV to about 100 kV and with a duty cycle in a range from about 5% to about 95%.

Figure 10:
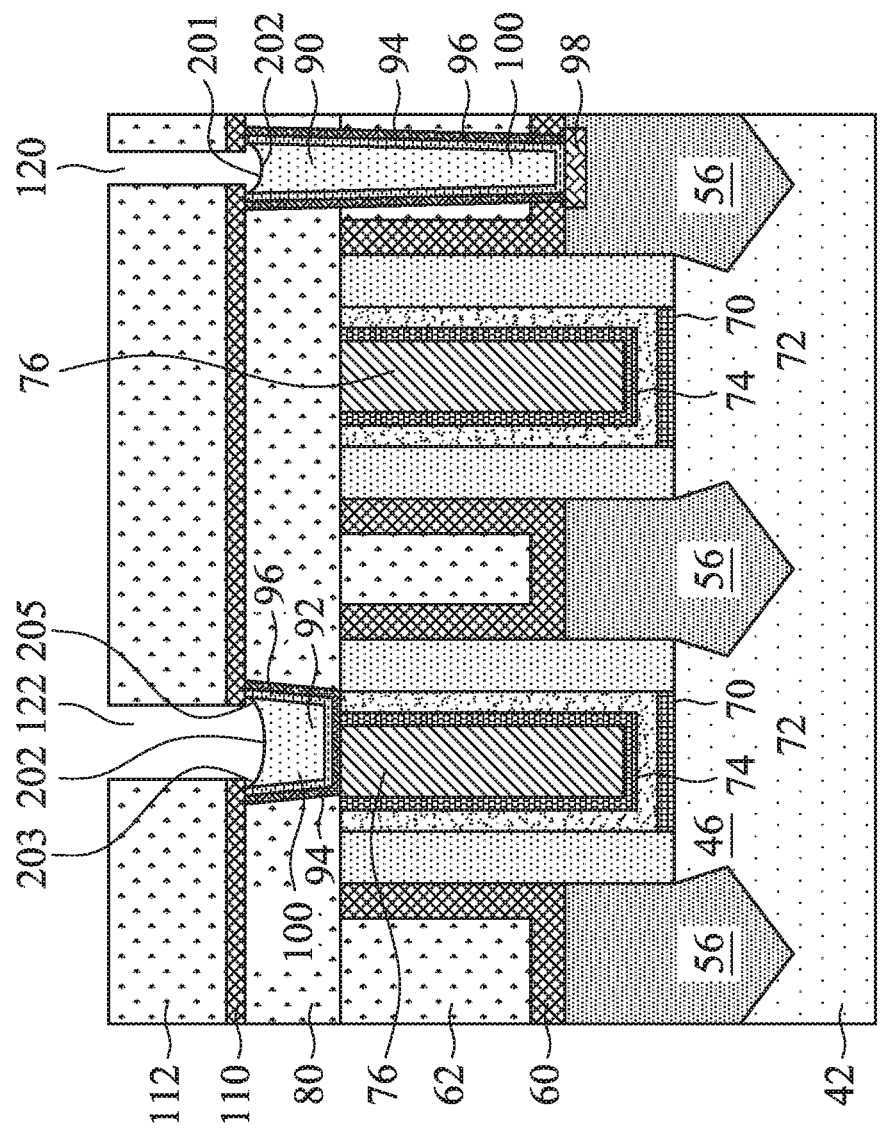

FIG. 10 illustrates the formation of recesses 202, 201 in the conductive features 90 and 92 and formed through the openings 120 and 122 to the conductive features 90 and 92, respectively, through the IMD 112 and ESL 110. After the openings 120, 122 are formed, a wet cleaning process may be performed to remove residuals as well as native oxides from the conductive features 90, 92. The residuals may come from the etching byproduct while forming the openings 120, 122 in the previous operation steps. The residuals may also come from the environment when transferring the substrate between different processing chambers while forming the IMD 112 and ESL 110. Furthermore, native oxides are often formed on the surfaces of the conductive features 90, 92. The wet cleaning process is performed to efficiently remove the residuals as well as the native oxides from the conductive features 90, 92. Furthermore, the wet cleaning process also etches the surface of the conductive features 90, 92 to form the recesses 202, 201 on the surface of the conductive features 90, 92 after the residuals and/or native oxide are removed therefrom.

In an example, the wet cleaning process can include immersing the semiconductor substrate 42 in deionized (DI) water or another suitable chemical (which may be diluted in DI water). It is believed that DI water may react with the native oxide grown on the surface of the conductive features 90, 92. In the example wherein the conductive features 90, 92 are fabricated from Co containing materials, DI water may efficiently react with $CoO_x$, thus removing the native oxide (e.g., $CoO_x$) along with a portion of the Co thereunder, forming the recesses 202, 201 on the conductive features 90, 92. The recesses 202, 201 may be formed as a concave surface (e.g., an upper concave surface on the conductive features 90, 92) having tip ends 203, 205 (as shown in the recess 202) formed under a bottom surface of the ESL 110. As the wet cleaning process is an isotropic etching process, the chemical reaction between the solution and the conductive features 90, 92 isotropically and continuously occurs when the solution contacts the conductive features 90, 92 until a predetermined process time period is reached. It is believed that the tip ends 203, 205 of the recesses 202 extend laterally from the conductive features 90, 92 and further extend underneath the bottom surface of the ESL 110. The tip ends 203, 205 may assist the materials subsequently formed therein to anchor and engage in the openings 120, 122 with better adhesion and clinch.

After the DI water cleaning, the semiconductor substrate 42 may further be optionally cleaned in a solution including other chemicals in DI water. Suitable examples of the chemicals include acid chemicals, such as citric acid, or a mixture of acid chemicals. The chemicals in the DI water may have a concentration from about 0.1% to about 20% by volume. The solution, during the immersion, may be at a temperature in a range from about 20° C. to about 90° C. The semiconductor substrate 42 may be immersed in the solution for a duration in a range from about 5 seconds to about 120 seconds to form the recesses 202, 201. After the cleaning, the recesses 202, 201 may have a depth 225 (see FIG. 12) from the top (e.g., horizontal) surface of the second ILD 80 in a range greater than 15 Å, such as from about 20 Å to about 100 Å, and more particularly, such as from about 30 Å to about 50 Å, although other depths may be achieved. The semiconductor substrate 42 may optionally be rinsed in isopropyl alcohol (IPA) following the immersion in the solution to dry the semiconductor substrate 42.

Figure 11:
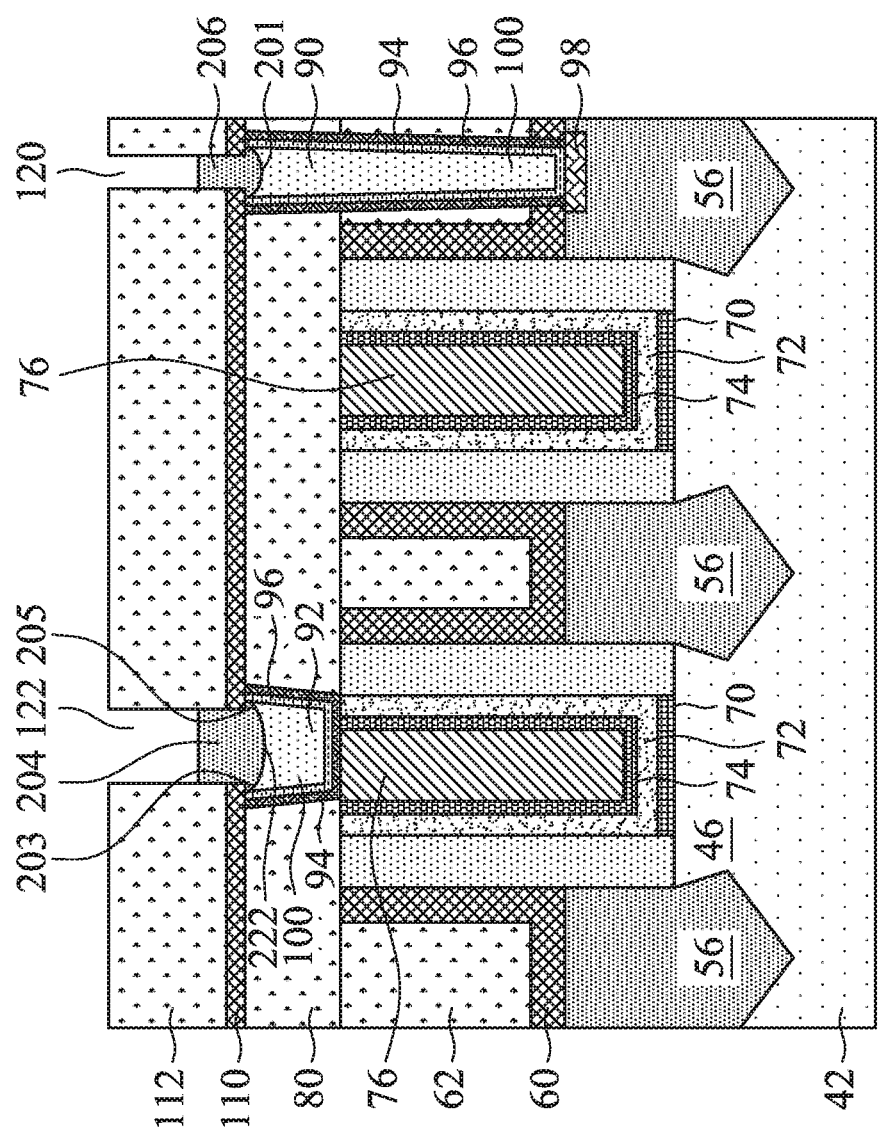

FIG. 11 illustrates the partial formation of second conductive features 204, 206 in the openings 120 and 122, respectively, in connection with the conductive features 90, 92. The second conductive features 204, 206 are formed in the recesses 202, 201 on the surface of the conductive features 90, 92, filling the recesses 202, 201 and forming the second conductive features 204, 206 in a bottom-up manner for filling the openings 120, 122.

By forming the second conductive features 204, 206 in a bottom-up manner, the second conductive features 204, 206 may be grown from the bottom surface, e.g., from the recesses 202, 201, to slowly and gradually grow the second conductive features 204, 206 predominately from the bottom, until a desired thickness/depth of the second conductive features 204, 206 is reached in the openings 120, 122. As a result, undesired defects, such as voids or seams, may be eliminated as the likelihood of forming the early closure of the openings 120, 122 or lateral growth in the openings 120, 122 is much reduced. Thus, the bottom-up deposition process assists forming the second conductive features as a seam-free (or void free) structure.

In an example, the second conductive features 204, 206 can be deposited in the openings 120, 122 by CVD, ALD, electroless deposition (ELD), PVD, electroplating, or another deposition technique. In a specific example, the second conductive features 204, 206 are formed by a thermal CVD process, without plasma generated during the deposition process. It is believed that a thermal CVD process may provide thermal energy to assist forming nucleation sites for forming the second conductive features 204, 206. The thermal energy provided from the thermal CVD process may promote incubation of the nucleation sites at a relatively long period of time. As the deposition rate is controlled at a relatively low deposition rate, such as less than 15 Å per second, the slow growing process allows the nucleation sites to slowly grow into the second conductive features 204, 206. The low deposition rate may be controlled by supplying a deposition gas mixture with a relatively low metal precursor ratio in a hydrogen dilution gas mixture, which will be described detail below. The nucleation sites are prone to form at certain locations of the substrate having similar material properties to the nucleation sites. For example, as the nucleation sites includes metal materials for forming the second conductive features 204, 206, the nucleation sites are then prone to adhere and nucleate on the metal materials (e.g., the first conductive features 90, 92) on the substrate. Once the nucleation sites are formed at the selected locations, the elements/atoms may then continue to adhere and anchor on the nucleation sites, piling up the elements/atoms at the selected locations, of the substrate, providing a selective deposition process, as well as bottom-up deposition process, is obtained. In the example depicted in FIG. 11, the nucleation sites are selectively incubated at certain locations (e.g., in the recesses 202, 201 above the first conductive features 90, 92) in the openings 120, 122, so that the second conductive features 204, 206 may grow from the recesses 202, 201 vertically from the bottom upward to fill in the openings 120, 122.

Figure 12:
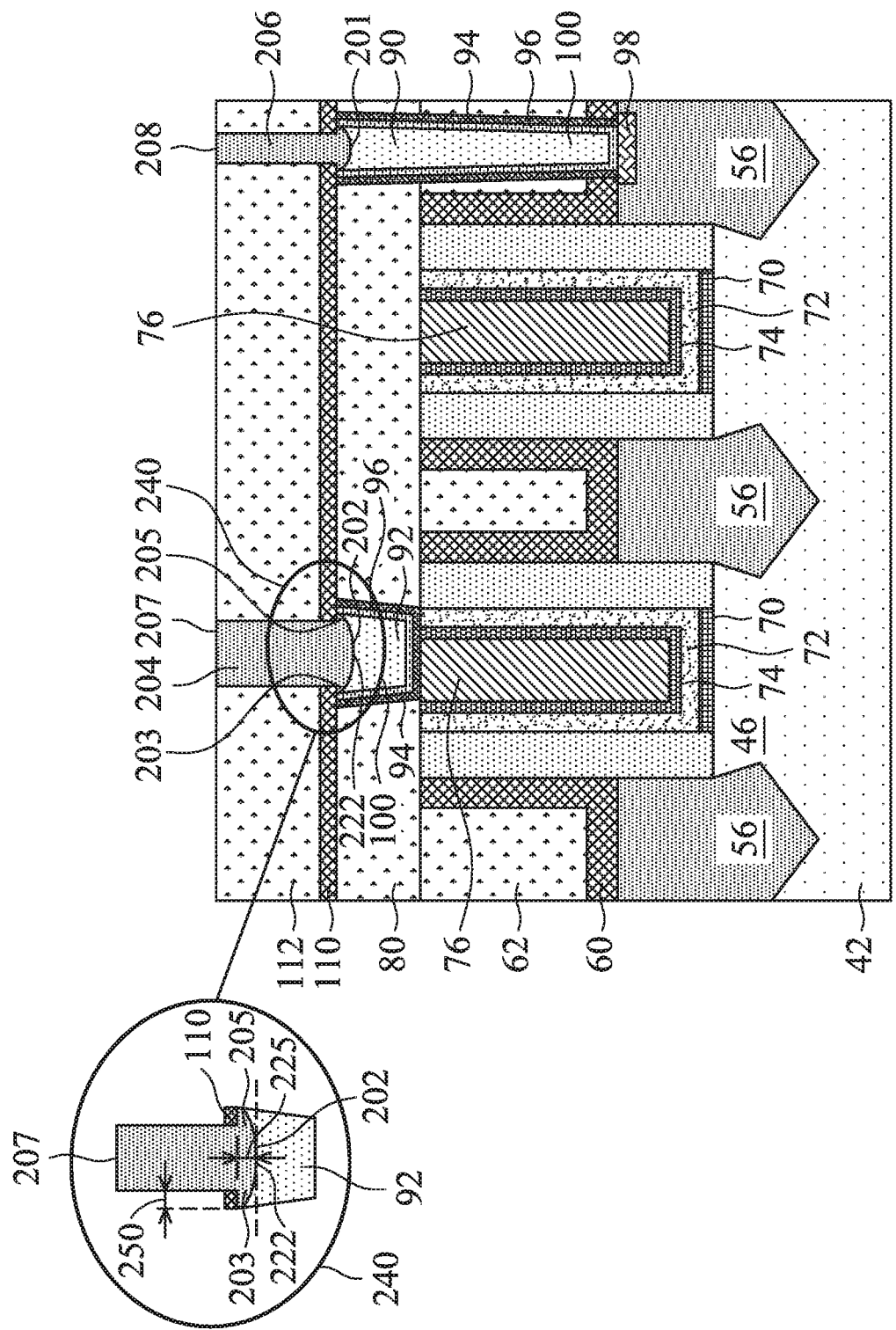

The second conductive features 204, 206 may be or comprise tungsten, cobalt, copper, ruthenium, aluminum, gold, silver, alloys thereof, the like, or a combination thereof. FIG. 11 depicts that the second conductive features 204, 206 partially fill the openings 120, 122 for ease of explanation of the bottom-up deposition process as the deposition process is not yet finished or terminated. When the second conductive features 204, 206 substantially fill the openings 120, 122, to form the completed second conductive feature 207, 208, the deposition process is then terminated, as shown in FIG. 12. As the second conductive features 207, 208 grow on the first conductive features 90, 92 and fill the recesses 202, 201, the resultant second conductive features 207, 208 may have a bottom portion having a substantially rounded and/or convex structure 222 (filling the concave surface from the recesses 202, 201 with the depth 225). The convex structure 222 extends laterally and outward below the ESL 110 and the below the top (e.g., horizontal) surface of the second ILD 80. The convex structure 222 has the depth 225 (e.g., the same depth from the concave surface from the recesses 202, 201) in a range greater than 15 Å, such as from about 20 Å to about 100<, and more particularly, such as from about 30 Å to about 50 Å, although other depths may be achieved. After the resultant second conductive features 207, 208 fill the recesses 202, 201, the second conductive feature 207, 208 include the tip ends 203, 205, respectively. The tip ends 203, 205 are in direct contact with the bottom surface of the ESL 110, as shown in the magnified view 240 in FIG. 12, having a width 250 in a range from 1 nm to about 5 nm.

The excess second conductive feature 207, 208 outgrown from the openings 120, 122 may be removed by using a planarization process, such as a CMP, for example. The planarization process may remove excess second conductive feature 207, 208 from above a top surface of the IMD 112. Hence, top surfaces of the second conductive feature 207, 208 and the IMD 112 may be coplanar. The second conductive feature 207, 208 may be or may be referred to as contacts, plugs, conductive lines, conductive pads, vias, etc.

Furthermore, the better interface management provided by the convex structure 222 and the tip ends 203, 205 may also prevent the second conductive features 207, 208 from undesirably pulling back at the subsequent CMP process.

In some examples, a barrier and/or adhesion layer is eliminated in the openings 120 and 122 before the second conductive feature 207, 208 is deposited in the openings 120 and 122. Since the examples depicted in FIGS. 11 and 12 show a bottom-up deposition process, a barrier and/or adhesion layer may be eliminated as the second conductive feature 207, 208 may be directly grown in the recesses 201, 202 from the underlying conductive features 90, 92 by forming the nucleation sites thereon with slow incubation. In some examples, different integration schemes, such as additional interface layers or bottom layers, may be utilized when different metal materials are used for conductive features 207, 208. Furthermore, as discussed above, the tip ends 203, 205 formed in the recesses 201, 202 also assist the mechanical attachment (e.g., an anchor-like stress and/or clinch) of the second conductive feature 207, 208 in the recesses 201, 202 to the underlying conductive features 90, 92, thus promoting interface adhesion and integration. Furthermore, as the conductive materials from the second conductive feature 207, 208 further extend downward to the conductive features 90, 92 at the interface where the convex structure 222 mated with the concave surface from the conductive features 90, 92, the overall surface contact area of the second conductive feature 207, 208 in the openings 120, 122 is increased, thus increasing the overall conductive contact surface area, promoting electrical performance and lower interface/contact resistance.

In an example, the bottom-up thermal chemical deposition process may be obtained by controlling a process pressure less than about 150 Torr, such as from about 5 Torr to about 100 Torr, for example about 20 Torr. The process temperature may be controlled in a range from about 200 degrees Celsius to about 400 degrees Celsius. A deposition gas mixture including at least a metal precursor and a reacting gas is used. In a specific example, the metal precursor is a tungsten containing precursor when the second conductive feature 207, 208 is a tungsten containing material. Suitable examples of the metal precursor material includes $WF_6$, $WCl_xR_{1-x}$, $W(CO)_6$ and the like. In an example, the deposition gas mixture includes $WF_6$. Other reacting gas, such as $H_2$, $N_2$, $NH_3$ and the like may also be supplied in the deposition gas mixture. In a specific example, the deposition gas mixture includes $WF_6$ and $H_2$. The reacting gas and the metal precursor may be supplied in the deposition gas mixture at a ratio greater than 20. For example, the $WF_6$ and $H_2$ may be supplied at a hydrogen gas dilution process. For example, the flow amount by volume of $H_2$ gas supplied in the deposition gas mixture is greater than $WF_6$ gas flow amount by volume. The flow amount by volume of $H_2$ gas is at least about 20 times greater than the flow amount by volume of $WF_6$ gas (e.g., $H_2/WF_6 > 20$). In a specific example, a ratio of the flow amount by volume of $H_2$ gas to the flow amount by volume of $WF_6$ gas is from about 30 to about 150, such as from about 40 to about 120. The RF source or bias power is not turned on and/or may not be necessary while supplying the deposition gas mixture. Thus, the deposition process can be a plasma free deposition process.

Figure 13:
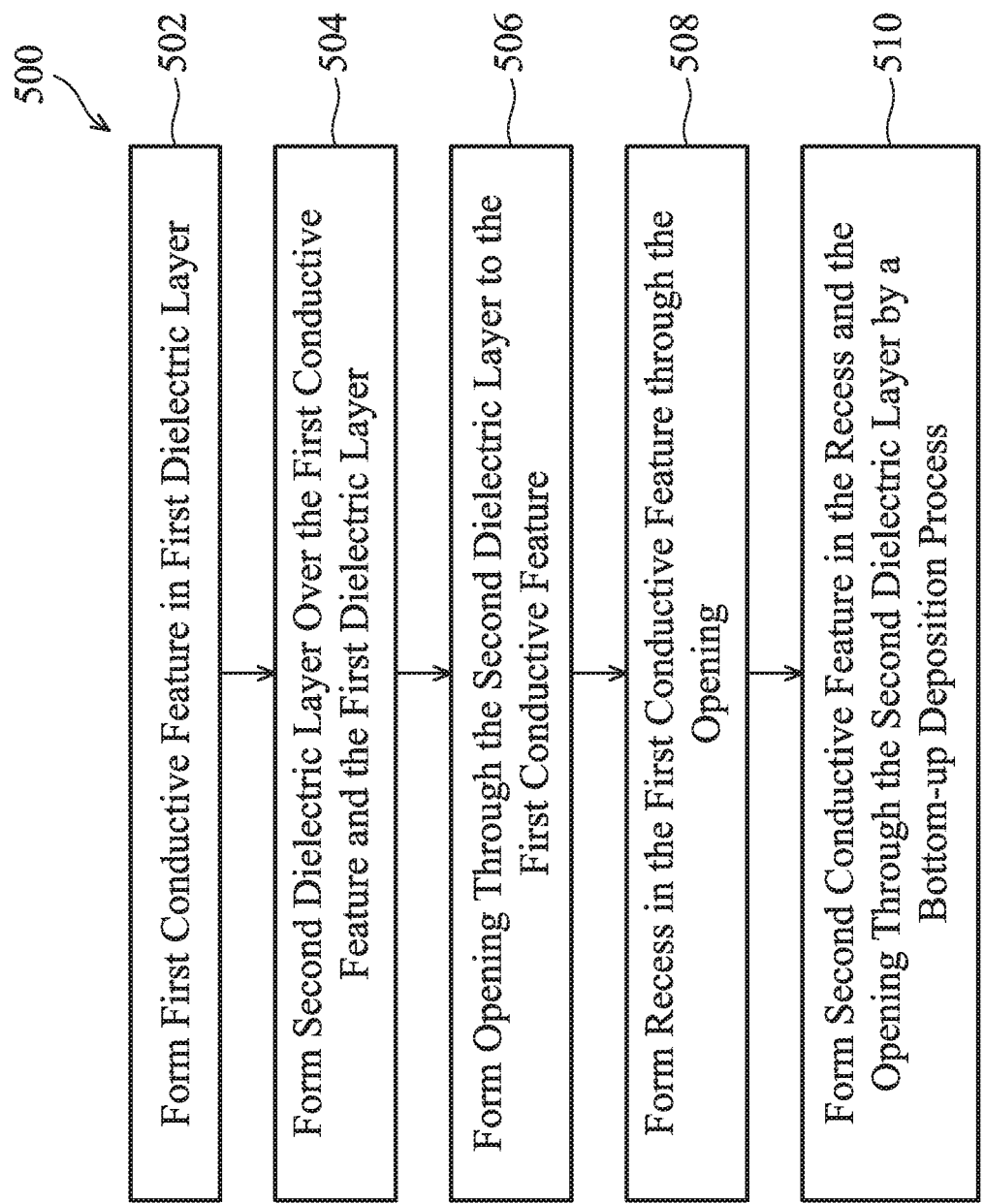
FIG. 13 is a flow chart of an example method for forming conductive features in accordance with some embodiments.

FIG. 13 is a flow chart of an example method for forming conductive features in accordance with some embodiments. In operation 502, a first conductive feature is formed in a first dielectric layer. An example of operation 502 is illustrated in and described with respect to FIGS. 6 and 7. For example, the conductive feature 90 is formed in the second ILD 80, the first ILD 62, and CESL 60.

In operation 504, a second dielectric layer is formed over the first conductive feature and the first dielectric layer. An example of operation 504 is illustrated in and described with respect to FIG. 8. For example, the ESL 110 and IMD 112 are formed over the conductive feature 90 and the second ILD 80, the first ILD 62, and CESL 60.

In operation 506, an opening is formed through the second dielectric layer to the first conductive feature. An example of operation 506 is illustrated in and described with respect to FIG. 9. For example, the opening 120 is formed through the ESL 110 and IMD 112 to the conductive feature 90.

In operation 508, a recess is formed in the first conductive feature exposed through the opening through the second dielectric layer. An example of operation 508 is illustrated in and described with respect to FIG. 10. For example, the recess 201 is formed in the conductive feature 90 exposed through the opening 120.

In operation 510, a second conductive feature is formed in the opening through the second dielectric layer and filling the recesses and contacting the underlying first conductive feature. The second conductive feature is formed by a bottom-up process without assistance of a barrier/adhesion layer at the interface where the second conductive feature is formed and grown on. An example of operation 510 is illustrated in and described with respect to FIGS. 11-12. For example, the second conductive feature 208 is formed in the opening 120 filling the recess 201 and contacting the first conductive feature 90.

Thus, by utilizing recesses formed between the first conductive features and the second conductive feature and filled by the conductive fill material, a better interface management and electrical properties may be obtained. Furthermore, the bottom-up deposition process of the second conductive feature may also assist forming the second conductive feature directly in contact with the underlying conductive features through the recesses without barrier layer/adhesion layer formed at the interface and sidewall, so better manufacturing control and device structures and performance may be obtained and achieved.

In an embodiment, a structure includes a first dielectric layer over a substrate, a first conductive feature through the first dielectric layer, the first conductive feature comprising a first metal, a second dielectric layer over the first dielectric layer, and a second conductive feature through the second dielectric layer having a lower convex surface extending into the first conductive feature, wherein the lower convex surface of the second conductive feature has a tip end extending laterally under a bottom boundary of the second dielectric layer. In an embodiment, the second conductive feature is in direct contact with the second dielectric layer. In an embodiment, the second dielectric layer includes an etching stop layer. In an embodiment, the tip end is in direct contact with a bottom surface of the etching stop layer. In an embodiment, the tip end has a width in a range from 1 nm and about 5 nm. In an embodiment, the lower convex surface has a depth of greater than 15 Å. In an embodiment, the second conductive feature includes a second metal different from the first metal. In an embodiment, the second conductive feature is a seam-free structure. In an embodiment, the first conductive feature includes cobalt, and the second conductive feature includes tungsten.

In another embodiment, a method includes forming a first conductive feature in a first dielectric layer, forming a concave surface on the first conductive feature, and forming a second conductive feature in a second dielectric layer. The second dielectric layer is over the first dielectric layer. The second conductive feature has a convex surface mating with the concave surface of the first conductive feature. The convex surface of the second conductive feature has a tip end extending laterally under a bottom surface of the second dielectric layer. In an embodiment, the convex surface has a depth greater than 15 Å. In an embodiment, the second conductive feature is formed by a bottom-up deposition process. In an embodiment, the bottom-up deposition process further includes supplying a deposition gas mixture including a metal containing gas and a reacting gas, and maintaining a process pressure less than 150 Torr. In an embodiment, a ratio of respective flow rates of the reacting gas to the metal containing gas is greater than 20. In an embodiment, the bottom-up deposition process is a plasma free thermal CVD process. In an embodiment, the concave surface of the first conductive feature is formed by a wet cleaning process. In an embodiment, the second conductive feature is in direct contact with the second dielectric layer without a barrier layer or an adhesion layer therebetween.

In yet another embodiment, a method for semiconductor processing includes forming a concave surface on a first conductive feature in a first dielectric layer by performing an isotropic etching process through a second dielectric layer, the second dielectric layer is over the first dielectric layer, and forming a second conductive feature in the second dielectric layer using a bottom-up deposition process. The second conductive feature having a convex surface mating with the concave surface on the first conductive feature. The convex surface of the second conductive feature has a tip end extending laterally under a bottom surface of the second dielectric layer. In an embodiment, the second conductive feature is formed without plasma. In an embodiment, the wet solution removes a native oxide from the first conductive feature to form the concave surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first dielectric layer over a substrate;
   a first conductive feature through the first dielectric layer, the first conductive feature comprising a first metal;
   a second dielectric layer over the first dielectric layer; and
   a second conductive feature through the second dielectric layer having a lower convex surface extending into the first conductive feature, wherein the lower convex surface of the second conductive feature has a tip end extending laterally under a bottom boundary of the second dielectric layer, wherein the lower convex surface of the second conductive feature extends continuously from a first sidewall of a conductive barrier layer of the first conductive feature to a second sidewall of the conductive barrier layer of the first conductive feature, and wherein the lower convex surface of the second conductive feature physically contacts the first sidewall of the conductive barrier layer and the second sidewall of the conductive barrier layer.

2. The structure of claim 1, wherein the second conductive feature is in direct contact with the second dielectric layer.

3. The structure of claim 1, wherein the second dielectric layer includes an etching stop layer.

4. The structure of claim 3, wherein the tip end is in direct contact with a bottom surface of the etching stop layer.

5. The structure of claim 1, wherein the tip end has a width in a range from 1 nm and about 5 nm.

6. The structure of claim 1, wherein the lower convex surface has a depth of greater than 15 Å.

7. The structure of claim 1, wherein the second conductive feature comprising a second metal different from the first metal.

8. The structure of claim 1, wherein the second conductive feature is a seam-free structure.

9. The structure of claim 1, wherein the first conductive feature comprises cobalt, and the second conductive feature comprises tungsten.

10. A structure comprising:
    a first contact in a first dielectric layer, the first contact having a concave top surface;
    a diffusion barrier layer on sidewalls of the first contact, the concave top surface of the first contact extends continuously from a first sidewall of the diffusion barrier layer to a second sidewall of the diffusion barrier layer, the first sidewall of the diffusion barrier layer extends above a point at which the concave top surface of the first contact physically contacts the first sidewall of the diffusion barrier layer, and the second sidewall of the diffusion barrier layer extends above a point at which the concave top surface of the first contact physically contacts the second sidewall of the diffusion barrier layer;
    an etch stop layer over the first dielectric layer; and
    a second contact extending through the etch stop layer to touch the concave top surface of the first contact.

11. The structure of claim 10, wherein the second contact has a different material composition than the first contact.

12. The structure of claim 11, wherein the first contact comprises cobalt, and wherein the second contact comprises tungsten.

13. The structure of claim 10, wherein the first contact and the second contact are electrically connected to a metal gate of a transistor.

14. The structure of claim 10, wherein a top surface of the second contact touches a bottom surface of the etch stop layer.

15. The structure of claim 10, wherein the first contact is physically separated from the etch stop layer by the second contact.

16. The structure of claim 10 further comprising an adhesion layer on sidewalls and a bottom surface of the diffusion barrier layer.

17. A structure comprising:
    a first dielectric layer over a substrate;
    a first conductive feature in the first dielectric layer, the first conductive feature comprising a first metal and having a concave top surface;
    a diffusion barrier layer on sidewalls and a bottom surface of the first conductive feature;
    a second dielectric layer over the first dielectric layer, the second dielectric layer covers tips of the concave top surface; and
    a second conductive feature through the second dielectric layer having a lower convex surface contacting the concave top surface of the first conductive feature, wherein the lower convex surface of the second conductive feature extends continuously from a from a first sidewall of the diffusion barrier layer to a second sidewall of the diffusion barrier layer, and wherein the lower convex surface of the second conductive feature physically contacts the first sidewall of the diffusion barrier layer and the second sidewall of the diffusion barrier layer.

18. The structure of claim 17, wherein the second conductive feature comprises a second metal different from the first metal.

19. The structure of claim 17 further comprising:
an adhesion layer between the diffusion barrier layer and the first dielectric layer.

20. The structure of claim 17 further comprising an etch stop layer between the first dielectric layer and the second dielectric layer, wherein the etch stop layer is physically separated from the first conductive feature by the second conductive feature.

* * * * *